United States Patent [19]

Dumoulin et al.

[11] Patent Number: 4,800,889
[45] Date of Patent: Jan. 31, 1989

[54] RAPID-SCAN NMR ANGIOGRAPHY

[75] Inventors: Charles L. Dumoulin, Ballston Lake, N.Y.; Steven P. Souza, Williamstown, Mass.

[73] Assignee: General Electric Company, Schenectady, N.Y.

[21] Appl. No.: 34,864

[22] Filed: Apr. 6, 1987

[51] Int. Cl.$^4$ .............................................. A61B 5/05
[52] U.S. Cl. ................................... 128/653; 324/306; 324/309
[58] Field of Search ................ 128/653; 324/306, 309, 324/322

[56] References Cited

U.S. PATENT DOCUMENTS

| | | | |
|---|---|---|---|
| 4,587,489 | 5/1986 | Wehrli | 324/309 |
| 4,667,159 | 5/1987 | Hodsoll, Jr. et al. | 324/309 |
| 4,710,717 | 12/1987 | Pelc et al. | 128/653 X |
| 4,714,081 | 12/1987 | Dumoulin et al. | 128/653 |

*Primary Examiner*—Ruth S. Smith
*Attorney, Agent, or Firm*—Geoffrey H. Krauss; James C. Davis, Jr.; Marvin Snyder

[57] ABSTRACT

A method for providing a nuclear magnetic resonance (NMR) angiographic image substantially only of moving spins associated with fluid flow in a living organism sample having a cardiac cycle at a cardiac rate, and immersed in a main static magnetic field, commences by nutating the spins by a preselected amount $\alpha$ less than 90°, in the initial part of each of a pair of imaging sequences. The repetition time interval $T_R$ between sequential nutations occurs at a rate greater than the cardiac rate. After each nutation, a pair of alternating-polarity flow-encoding signal pulses are generated in a first magnetic field gradient impressed upon the sample, with each of the flow-encoding pulses in the first sequence of each pair having a polarity opposite to the polarity of the like-positioned flow-encoding pulse in the second sequence of each pair. The NMR response echo signal is acquired and the difference in the data from the pair of sequences is used to display at least one projection angiographic image.

21 Claims, 1 Drawing Sheet

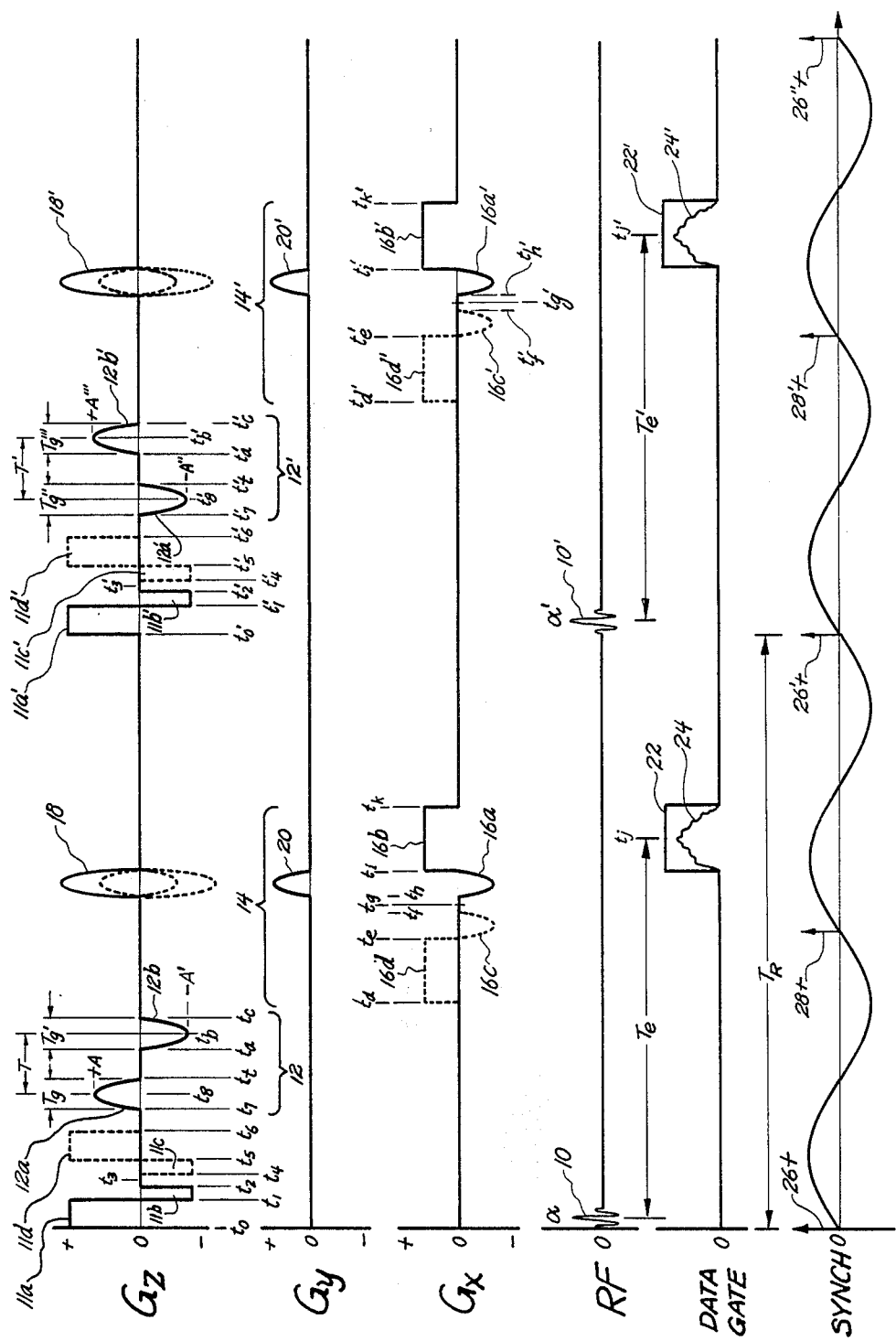

RAPID-SCAN NMR ANGIOGRAPHY

BACKGROUND OF THE INVENTION

The present invention relates to nuclear magnetic resonance (NMR) angiographic methods for imaging fluid flow in a sample and, more particularly, to novel NMR angiographic methods in which a single response is generated for each excitation of the sample and with many excitations occurring in each cardiac cycle, to provide medically-significant anatomy images of averaged fluid flow, in non-invasive manner.

It is known to provide NMR angiographic projection images, indicating the flow of bodily fluids through various bodily passages, for medical diagnostic purposes. Methods for producing such images are described and claimed in co-pending U.S. patent application Ser. No. 835,683, filed Mar. 3, 1986, now U.S. Pat. No. 4,714,081, issued Dec. 22, 1987, and application Ser. No. 013,592, filed Feb. 11, 1987, both assigned to the assignee of the present application and incorporated here in their entireties by reference. While those methods provide true projection images (through the entire anatomical thickness) and allow high quality NMR angiograms of arterial and venational structures to be obtained along one or more selected projection axes and with a selected direction of flow sensitivity in a sample, it is still highly desirable to obtain the same, or more, information in the NMR angiograms in a shorter time interval. This is especially important in human diagnostic imaging, where the likelihood of patient movement increases with increased imaging time. Other benefits, such as the ability to acquire three-dimensional flow information, saturate non-moving spins (for additional suppression of non-moving spins), and/or measurement of total vessel flow (particularly in a sample having a cardiac cycle) are also desirable. Accordingly, methods for providing NMR angiograms with improved features, while substantially reducing both data acquisition time and sample motional sensitivity, are highly desirable.

BRIEF SUMMARY OF THE INVENTION

In accordance with the invention, methods for providing a nuclear magnetic resonance (NMR) angiographic image substantially only of moving spins associated with fluid flow in a living organism sample having a cardiac cycle at a cardiac rate, includes the steps of: immersing the sample in a main static magnetic field; nutating by a preselected amount $\alpha$ less than 90°, in the initial part of each of a first sequence and a second sequence of a sequential pair of imaging sequences for a multiplicity N of pairs for each of a multiplicity S of phase-encoding amplitudes operating upon said selected sample portion, the spins of all nuclei of a selected species, where the repetition time interval $T_R$ between sequential nutations occurs at a rate greater than the cardiac rate; after each nutation a pair of alternating-polarity flow-encoding signal pulses are generated in a first magnetic field gradient impressed upon the sample, in a first direction selected to cause a resulting NMR response echo signal from the spin of a moving nucleus to differ from the NMR response echo signal from the spin of a substantially stationary nucleus; each of the flow-encoding pulses in the first sequence of each pair has a polarity opposite to the polarity of the like-positioned flow-encoding pulse in the second sequence of each pair; acquiring, responsive to a readout magnetic field gradient impressed upon the sample in a second direction, independent of the first direction, a set of data from the NMR response echo signal evoked, from at least the sample portion, in the response data acquisition time interval of each of the first and second sequences; subtracting the data in each of the NMR response signal data sets acquired in a selected one of the first and second sequences, from the data in the data set of the remaining one of the first and second sequences, to generate one of a like plurality N of difference data sets from which response data obtained from stationary nuclei has been substantially removed; averaging all N difference data sets for each of the plurality S of phase-encoding amplitudes operating upon the sample; and generating, responsive to all averaged difference data sets, an angiographic projection image lying in a plane having a preselected relationship with respect to the first and second directions.

In presently preferred embodiments of our novel rapid-scan NMR angiographic method, the use of a nutation angle $\alpha$ between about 15° and about 30° still allows the multiplicity of sequences to produce a single image with increased signal-to-noise ratio and total-flow angiographic information, while providing increased suppression of motional artifacts. Velocity dispersion effects are substantially eliminated by use of flow-compensation gradients in the slice selection and/or readout directions.

Accordingly, it is an object of the present invention to provide novel methods for rapid-scan nuclear magnetic resonance angiographic imaging of moving fluid flowing in vessels through a desired portion of a sample, such as the anatomy of a living subject.

This and other objects of the present invention will become apparent upon reading the following detailed description of my invention, when considered in conjunction with the drawings.

BRIEF DESCRIPTION OF THE DRAWINGS

The sole FIGURE is a set of time-coordinated graphs illustrating magnetic field gradient, RF and data gate signals for one complete sequential pair of sequences of a presently preferred embodiment of a rapid-scan NMR angiographic sequence for acquiring flow information for a system utilizing gradient fields arranged along Cartesian coordinate system axes.

DETAILED DESCRIPTION OF THE INVENTION

The method of the present invention is practiced in a nuclear magnetic resonance (NMR) system in which a sample, e.g., a patient, is placed in an imaging region in which a highly homogeneous and relatively high-intensity static magnetic field $B_0$ is provided. As is well-known to the art, the static magnetic field $B_0$ is formed along a chosen volume axis, e.g., the Z axis of a Cartesian coordinate system having its center within the bore of a magnet means providing the static field. Magnetic field gradient-forming means are used to form a set of substantially orthogonal magnetic field gradients impressed upon the static field. For the Cartesian coordinate system, the gradients $G_X$, $G_Y$ and $G_Z$ can be summarized as: $G_Z = \partial B_0/\partial z$, $G_Y = \partial B_0/\partial y$, $G_X = \partial B_0/\partial x$. In addition to the static magnetic field $B_0$ and the magnetic field gradients $G_X$, $G_Y$ and $G_Z$ therein, the sample is subject to a radio-frequency (RF) magnetic field $B_1$ rotating at the resonance, or Larmor frequency $\omega = \gamma B_0$, where $\gamma$ is the gyromagnetic constant for the particular nuclear species to be imaged. The static magnetic field $B_0$, the magnetic field gradients $G_X$, $G_Y$ and $G_Z$ and the RF magnetic field $B_1$ are all provided by means, and in manner, well known to the art. Reference to allowed U.S. patent application Ser. No. 743,114, filed June 10, 1985, now U.S. Pat. No. 4,667,159, issued May 19, 1987, assigned to the assignee of the present invention and incorporated herein in its entirety by reference, can be had for background information both as to the general system definitions and apparatus, and as to synchronization of NMR sequences to events external of the system. Previously, angiographic imaging of living fauna required providing cardiac (EKG) signals to the NMR imaging system from the cardiac portion of the sample, e.g. from the chest area of the patient to be imaged. As explained in the forementioned applications, cardiac gating of the NMR angiography sequences could be used to prevent periodic motion artifacts, i.e., ghosts, from appearing in the final image and or for selecting a particular portion of interest of the cardiac cycle during which the angiograph is taken.

The NMR angiographic methods of the aforementioned applications allowed data for at least one, and often several different, angiographic projection(s) to be acquired in each of the plurality S of acquisition time intervals, each triggered by a cardiac cycle event of the patient sample. Thus, each sequential pair of applications of magnetic field gradient and RF magnetic field pulse signals provides at least one difference set of NMR response signals containing information as to the concentration of motion of the spins of a selected nuclear specie, when viewed along one imaging axis of projection or several different projection axes, but always for only one of the multiplicity S (typically 128 or 256) of phase-encoding gradient amplitudes operating upon the sample and producing information for the projection image. Therefore, when acquiring data for a single angiographic projection, along a selected projection axis $A_n$, at least S sequential pairs of pulse sequences were required with each sequence positioned in a different sequential, non-overlapping acquisition time interval triggered by a selected cardiac event, i.e. with a repetition time interval $T_R$, between the start times of any sequential pair, being set by the sample's pulse rate. Since each interval is typically in the 0.5-1.0 second range for a human patient with a pulse rate in the 60-120 B.P.M. range, the procedure would require from about 2 to about 4 minutes if a single response signal was sufficient; longer examination times will be required if several response signals must be acquired and averaged to increase the signal-to-noise ratio of the final angiograph. In either case, the patient would have to be relatively constrained in a single position during the entire time, to reduce motional artifacts.

In accordance with one aspect of the invention, the acquisition of each of a plurality of informational echo responses from a different excitation sequence is provided by using a sequence repetition time $T_R$ which is much less than the time between the like events in the cardiac cycle of the sample fauna being imaged, i.e. $T_R << (60/PR)$, where $T_R$ is in seconds and PR is pulse rate, in beats per minute. Each additional pair of echoes is utilized to provide additional signal to supplement the information obtained in the response of the first echo sequence.

Prior to describing the various presently preferred embodiments of our novel rapid-scan NMR angiographic method, a brief statement is presented of the applicable theory for imaging macroscopic spin motion by a monitoring of spin magnetization phase. The required information about transverse spin magnetization phase change is readily derived from a bimodal flow-encoding gradient pulse set, i.e. a pair of pulses having opposite polarity in each excitation sequence, and with polarity alternating in alternating ones of the sequences. The Larmor frequency ($\omega$), in the presence of a magnetic field gradient, is dependent upon the position of the spin providing the response signal; thus, $\omega(z) = \gamma(B_0 + z \cdot G_z)$, where $G_z$ is the magnetic field gradient strength in the desired direction, e.g. the Z direction. Responsive to an applied gradient pulse which starts at a time $t = 0$ and ends at another time $t = T_g$, the transverse spin magnetization phase change $\phi$ is $$\phi = \gamma \int_0^{T_g} Z(t) G_z(t) dt \quad (1)$$

where z(t) and $G_z(t)$ are the spin position and gradient field strength as respective time functions. Both moving and non-moving excited spins will be subjected to the gradient field; only the moving excited spins have a non-constant spin position time function z(t). If the excited spins experience constant motion of the direction of the applied field gradient, this spin position time function z(t) is $z(t) = Z_0 - Vt$, where $Z_0$ is the spin position at time $t = 0$ and V is the spin velocity. Thus, $$\phi = \gamma \int_0^{T_g} Z_0 G_z(t) dt - \gamma \int_0^{T_g} V t G_z(t) dt. \quad (2)$$

When a second gradient pulse $G'_z(t)$ is applied to the sample at a time T after the beginning of the first gradient pulse, the entire phase shift $\phi$ introduced by the gradient magnetic field pulse pair is given as:

$$\phi = \gamma \int_0^{T_g} Z_0 G_z(t) dt - \gamma \int_0^{T_g} V t G_z(t) dt + \quad (3)$$

-continued
$$\gamma \int_T^{(T+T_g)} Z_1 G'_z(t)dt - \gamma \int_T^{(T+T_g)} VtG'_z(t)dt,$$

where $Z_1$ is the position of the spin at the commencement of the second gradient pulse $G'_z(t)$. If the second gradient pulse is made identical in shape and amplitude to the shape and amplitude of the first gradient pulse, but is given opposite polarity, i.e. $G'_z(t) = -G_z(t)$ and $T'_g = T_g$, equation 3 reduces to $$\phi = \gamma A_g (Z_0 - Z_1) \qquad (4)$$

where $A_g$ is the total area under each gradient pulse. Since the velocity of the spins is assumed to be constant, $Z_0 - Z_1 = VT$, and therefore, $\phi = \gamma A_g VT$, which provides the basis for selective detection of moving spin magnetization; it will be seen that the phase shift induced in the spin magnetization of stationary spins, having (by definition) a velocity $V = 0$, by a bimodal pair of gradient pulses, is itself zero. Conversely, it will be seen that the phase shift induced by moving spin magnetization depends linearly on the spin velocity V, the interpulse delay time interval T and the gradient pulse area ($A_g$). Therefore, data acquired for two different conditions of any of these three variables (V, T or $A_g$) can be subtracted, one from the other, to leave a resultant containing only spin density information for moving spins. As discussed in the aforementioned application, while NMR angiography will work with one sequence of a pair being devoid of the bimodal gradient pulses, a better result is obtained if the polarity of the flow-encoding gradient pulses are inverted on alternate excitations; this form is used in the illustrative pulse sequences described herein.

From the foregoing brief theoretical exposition, it will be seen that the complex difference of two data sets, each acquired from a different one of two echoes (as described above) has a modulus which is a sinusoidal function of spin velocity. This presents the possibility of aliasing conditions wherein certain spin velocities will provide no observed signal, or will be indistinguishable from lower spin velocities. The aliasing problem can be obviated if the induced phase shift is constrained to be less than $\pi/2$ radians. In fact, if the induced phase shift $\phi$ is constrained to be less than one radian, the image intensity is approximately linear with respect to spin velocity. Since the measured signal intensity is also a linear function of the number of spins, image pixel intensity is proportional to volume (and therefore mass) flow, so that the total flow of blood within a vessel can be measured by integrating the signal intensity across the vessel. While only that flow component in the direction of the applied flow-encoding gradient is imaged with such a pulse sequence, the total flow angiogram can be obtained by acquiring two separate angiograms, each sensitive in a flow direction orthogonal to one another and also orthogonal to the projection axis, and combining these two individual angiograms using the relationship $I_t = (I_A^2 + I_B^2)^{\frac{1}{2}}$, where $I_t$ is the total intensity and $I_A$ and $I_B$ are the intensities of the corresponding pixels in the two orthogonal angiograms. Finally, it should be realized that an angiogram can be generated by providing the flow-encoding gradient pulses with any standard imaging procedure. The imaging procedure utilized here is the gradient-refocussed spin-warp sequence, although spin-echo refocussed spin-warp and the like procedures can be utilized.

Referring now to the sole FIGURE, our presently preferred rapid-scan NMR angiographic method utilizes at least one pair of sequences to acquire the response data from one phase-encoding gradient amplitude of the plurality S of such amplitudes needed for a complete projection image. Each sequence commences with nutation of the nuclear species magnetization by a flip angle $\alpha$, caused by a radio-frequency (RF) signal pulse 10, commencing at a sequence start time $t_0$. Although standard magnetic resonance images may be provided with limited thickness, angiograms are generally obtained as projections through the entire anatomical thickness so that any slice-selective gradient in the direction of projection is weak or absent, although a slice-selective gradient can be applied in an orthogonal direction (either the readout direction or the phase-encoding direction) to limit the field of excitation, if desired. In the illustrated sequence, wherein the projection direction is along the Y axis, a excitation-limiting slice-selective gradient signal pulse 11a is provided in the phase-encoding direction along the Z axis, during the presence of the RF nutation signal pulse 10, from time $t_0$ to time $t_1$. A rephasing pulse portion 11b, from time $t_1$ to time $t_2$, can be provided, with an amplitude such that the total area under the rephasing pulse lobe 11b is substantially equal to one-half the total area under the slice-selective gradient pulse lobe 11a. We presently prefer RF signal pulse 10 to nutate, or "flip", the spin magnetization vector through an angle $\alpha$ between about 15° and about 30°, although lesser or greater flip angles can be utilized.

The nutated spins are flow-encoded during a next-subsequent angiographic subsequence 12. A bipolar pair of flow-encoding pulses 12a and 12b, of opposite polarity, are utilized. Thus, the first flow-encoding signal pulse 12a commences at time $t_7$, rises to a maximum positive amplitude $+A$ substantially at pulse midtime $t_8$, and returns to a substantially zero amplitude at pulse termination time $t_t$, for a total pulse time interval $T_g$. Shortly thereafter, the opposite-polarity second flow-encoding signal pulse 12b occurs, commencing at time $t_a$ and falling to a maximum negative value $-A'$ substantially at pulse midtime $t_b$ (which pulse midtime is equal to the interpulse time interval T after the midtime $t_8$ of first pulse 12a), before returning to a substantially zero amplitude at pulse termination time $t_c$, with a pulse time interval $T_g'$. Advantageously, the pulse time intervals are essentially equal, so that $T_g = T_g'$. Each of the bipolar pulses induces a phase shift in all spins of the sample, although the opposite polarity flow-encoding pulses of the sequence of the pair, is hereinbelow described, essentially negates the effects upon stationary spins.

After flow-encoding the spins of the entire volume from which flow information is to be projected, information about the tagged spins must now be acquired, in an imaging subsequence 14 commencing after angiographic flow-encoding subsequence 12 termination time $t_c$ and terminating before the start of the next angiographic sequence at time $t_0'$. The actual imaging subsequence can be selected from a wide range of such sequences, such as the presently-known spin-echo, spin-warp and the like subsequences. A gradient-refocussed spin-warp imaging subsequence is illustrated, with the readout gradient signal occurring in a readout direction along the X axis of the Cartesian coordinate system and with the phase-encoding direction lying along the Z, or axial, direction. Thus, a readout signal dephasing pulse portion 16a commences at a time $t_h$, and terminates at a time $t_i$; the readout gradient signal pulse 16b following immediately thereafter, and lasts until the end of the NMR response signal readout interval, at time $t_k$. Essentially simultaneous with the readout dephasing pulse 16a, one of a plurality S of different amplitudes of phase-encoding signal pulse 18 is provided. Also substantially simultaneous with pulses 16a and 18, a projection-dephasing signal pulse 20 is applied in the gradient, e.g. gradient $G_y$, in the projection direction, e.g. the +Y axis perpendicular to the XZ plane of projection, to limit the dynamic range of response signals from stationary spins. Substantially concurrent with the readout gradient pulse 16b, a response data gate 22 is enabled, to allow the NMR angiographic response signal 24 to be received, digitized and processed, in known imaging manner. The center of the readout pulse 16b/data gate enable portion 22, at time $t_j$, is at a fixed time interval $T_e$ from the center of nutation pulse 10.

The second sequence (of each sequence pair) now occurs with exactly the same amplitude and timing values as in the first sequence, except for the inversion of the polarity of the flow-encoding pulses, i.e. first flow-encoding pulse 12a' has a negative polarity and second flow-encoding pulse 12b' has a positive polarity. This second sequence, starting at a time $t_0'$ (which is at a repetition time interval $T_R$ after the first sequence start time $t_0$), also has an initial RF nutation signal pulse 10', nutating the spins of the selected species through a flip angle $\alpha'$, which is substantially equal to the flip angle $\alpha$ of the first sequence nutation pulse 10. The nutation pulses can be of any desired envelope shape, including the truncated sin(x)/x shape illustrated. If a slice-selective phase-encoding gradient pulse 11a and its rephasing pulse 11b were utilized in the first sequence, similar pulses 11a' and 11b' are utilized in the second sequence. In the second sequence flow-encoding subsequence 12', the aforementioned negative-polarity first pulse 12a' has an amplitude $-A''$ and a duration $T_g''$, while the subsequent positive-polarity pulse 12b' has an amplitude $+A'''$ and a duration $T_g'''$, with the pulse temporal midpoints $t_g'$ and $t_b'$ being separated by a time interval $T'$. Advantageously, the amplitude values $A''$ and $A'''$ are substantially equal and are each equal to the amplitude value $A = A'$ of the first sequence; the pulse durations $T_g''$ and $T_g'''$ are equal to each other and to the pulse duration value $T_g = T_g'$ of the first sequence, while the interpulse time interval $T'$ is equal to the interval $T$ of the first sequence. In the second sequence imaging subsequence 14', an imaging gradient dephasing pulse 16a' (similar to pulse 16a of the first sequence) is present substantially simultaneously with a phase-encoding pulse 18' (which has the same one of the S amplitudes values as pulse 18), and with a projection-dephasing pulse 20' (which is similar to first sequence pulse 20). The subsequent readout gradient portion 16b' occurs substantially simultaneously with the data gate enablement portion 22', having their midtimes $t_j'$ at the time interval $T_e'$ (substantially equal to $T_e$), from the midpoint of second sequence RF pulse 10'. The second sequence response signal 24' is processed in the same manner as the first sequence response signal 24. The data set obtained from response signal 24' is subtracted from the data set obtained from response signal 24, to provide a difference data set. Advantageously, a number N of pairs of sequences will be used for each of the S phase-encoding gradient amplitudes, we presently prefer to use $30 \leq N \leq 64$, if at all practical, to provide for each amplitude a relative large number of difference data sets which can be averaged to greatly improve the signal-to-noise ratio, and hence the contrast, of the final image. It should be understood that any number N of sequence pairs, from N = 1 to any practical higher limit, can be utilized, if desired.

In accordance with one aspect of the invention, the sequence repetition time interval $T_R$ is very much less than the cardiac cycle pulse time interval of the living sample being investigated. For a typical human subject, with pulse rate of about 60–120 B.P.M., pulse time intervals of between 0.5–1.0 second occur. We presently utilize repetition time intervals $T_R$ between about 30 milliseconds and about 60 milliseconds, with a typical echo time interval $T_e$ between about 15 milliseconds and about 45 milliseconds. In particular, we prefer to synchronize the commencement of each sequence, at its start time $t_0, t_0', \ldots$, to zero crossings of the periodic AC waveform of the powerline energizing the NMR imaging system. Thus, there is no attempt to synchronize the angiographic sequence to the cardiac cycle of the patient sample. In particular, we have found that synchronizing on every C-th positive-going zero crossing of the powerline, where C is a positive integer, provides a repetition time interval $T_R = C/F_L$, where $F_L$ is the powerline frequency (substantially equal to 60 Hz. in the United States). With C=2, interval $T_R$ is approximately equal to 1/30 seconds, or about 33.3 milliseconds. That is, the first positive-going zero crossing 26+ of the synchronizing SYNCH powerline waveform causes commencement of the first sequence of the sequence pair; the next immediate zero crossing 28+ of the AC waveform is ignored (as by processing the output of any of the many zero crossing detectors known to the circuit art, through a simple divide-by-two logic element, such as a flip-flop and the like), so that the second sequence of the sequence pair is triggered on the second-subsequent, positive-going zero crossing 26'+. The next pair of sequences commences at a fourth-subsequent positive-going zero crossing 26'', with the intervening odd-numbered (third-subsequent) positive-going zero crossing 28'+ being again ignored.

Recapitulating, an angiographic projection image is acquired with short repetition time interval $T_R$ (e.g. about 33.3 milliseconds), and shorter echo time interval $T_e$ (e.g. about 20-25 milliseconds), and with RF flip angle $\alpha$ of less than 90° (e.g. about 15° to about 30°). The acquisition of each echo is synchronized to a non-cardiac-cycle source, such as the line frequency of the electrical power supply to the imaging system. The number N of excitation/response sequence pairs for each step value of the plurality S of phase-encoding pulses, can be any integer value, although a fairly large number of excitation sequence pairs per phase encoding step, e.g. about 30 to about 64, has proven beneficial. The phase of the flow-encoding pulses are inverted on alternate acquisitions, while the phase and magnitude of all of the gradient pulses and the RF pulse are kept constant, with, of course, the exception of the phase-encoding gradient pulse, which is monotonically advanced in amplitude in a normal spin-warp fashion (to the next one of the S different values, after each N sequence pairs). Data acquisition is limited only by the necessity for having two similar data matrices, such that the matrix resulting from the second sequence of the sequence pair can be subtracted from the first sequence matrix, to yield the difference matrix for realization of the angiographic image. We typically acquired data in a 128×256 matrix, and zero fill that matrix to 256×256, prior to Fourier transformation in the phase-encoding dimension. Two images, with orthogonal flow-encoding gradient directions, can be combined, with the image intensity of the total angiograph being the modulus of the two orthogonally flow-encoded images. Such total flow projection images can typically be acquired in a total acquisition time of about 4 minutes.

We have found, as in normal spin-warp imaging, that flow artifacts are a serious problem in angiographic projection imaging. In fact, because a large volume (encompassing many blood vessels) is typically excited and detected in NMR angiography, flow artifacts may be more of a problem than in normal limited-slice NMR imaging. Also, because the stationary spin density information is suppressed, NMR angiographic projection imaging flow artifacts are more apparent than in many other imaging forms. We have found that relatively small flow artifacts, which might not even be noticeable in a traditional limited-slice NMR image, can greatly degrade the quality of a NMR angiographic projection image; ideally, all signals should be absent in any region having no blood flow. The visually-manifested flow artifacts appear as a smearing or ghosting of vessel intensity in the flow-encoding dimension, e.g. in the Z-axis dimension with the illustrated sequence. These artifacts are apparently caused by the pulsatile nature of blood flow, rather than by the flow presence itself. Pulsatile flow appears to cause phase spin fluctuation, as the response signal phase $\phi$, per equation 1, is directly proportional to spin velocity V. The final portion of signal information in the phase-encoding dimension of an image is determined by the spin magnetization phase, so that random phase fluctuation (due to pulsatile flow) causes a loss of moving spin intensity definition in the phase-encoding dimension. The most obvious solution to the flow artifact problem, is to synchronize data collection with the cardiac cycle, so that cardiac gating insures consistent blood velocity within each image voxel, for the acquisition of each scan echo. Unfortunately, cardiac gating requires a relatively long $T_R$ and a longer imaging time.

We prefer to suppress flow artifacts by the use of flow-compensation signals in the magnetic field gradients, to remove that flow phase shift which is independent of flow velocity, for flow velocities which do not change in the short time between sequential application of the flow-compensation gradients and the gradient pulses being compensated for. As blood velocity typically cannot change by an appreciable amount in the echo time interval $T_e$ (between the RF pulse and the echo acquisition), flow compensation gradient pulses have proved successful in reducing flow artifacts, but at the expense of increasing the minimum sequence repetition time interval $T_R$. Thus, the bipolar slice-selective gradient pulses 11a and 11b are flow-compensated by a subsequent substantially time-reversed pair of pulses 11c and 11d; a temporal mirror-image of the rephasing pulse 11b is provided as first flow-compensation pulse 11c, with the same amplitude as pulse 11b, and with a duration, from time $t_4$ to time $t_5$, equal to the original pulse amplitude (i.e. from time $t_1$ to time $t_2$). Also mirrored about intermediate time $t_3$, the positive-polarity pulse 11d has the same amplitude as the pulse 11a being compensated for, and has a duration, from time $t_5$ to $t_6$, essentially equal to the time, from $t_0$ to time $t_1$, of pulse 11a. Similarly, in the second sequence, the slice-selective bipolar pulses 11a' and 11b' are flow-compensated for by mirror pulses 11c' and 11d', having the same amplitude and time duration characteristics as pulses 11c and 11d in the first sequence. The readout gradient bipolar pulses 16a and 16b are flow-compensated for by pulses 16c and 16d, mirrored about time $t_g$ in the first sequence; in the second sequence, the bipolar readout gradient pulses 16a' and 16b' are flow-compensated for by pulses 16c' and 16d', mirrored about time $t_g'$.

The effect of the unipolar phase-encoding gradient pulse 18/18' cannot be cancelled by a mirror-image signal; in the presence of flow in the sample, there will always be some projection image registration error, in the phase-encoding (e.g. Z-axis) direction. The error magnitude $X_{error}$ is given by:

$$X_{error} = VT_{p-e}/2, \qquad (5)$$

where $T_{p-e}$ is the duration of the error-inducing gradient pulse, e.g. from time $t_h$ to $t_i$. It will be seen that $X_{error}$ is relatively small (e.g. 0.5 millimeters) under normal imaging conditions (e.g. $T_{p-e}$ of about 5 milliseconds) and for expected flow velocities (e.g. about 20 centimeters/sec.). For an angiographic projection with a 20 cm. field of view and data acquisition in a 256×256 matrix, each pixel images an area of about 0.8 mm. on each side, so that a registration error of 0.5 mm. corresponds to a flow intensity shift of less than one pixel (i.e. there is no "shadow"). Because of the short $T_R$ interval (which also causes rapid saturation of stationary spins for additional suppression), this form of projection sequence is relatively insensitive to motion of the sample patient; the flow-encoding gradients are inverted on alternating acquisitions and, with short $T_R$, maximum suppression of non-moving spins obtains in the subtraction portion of the process, even if normal breathing and occasional swallowing occur.

The use of flow-compensation gradient signal pulses is not, alone, sufficient to suppress all flow artifacts, and especially not those artifacts due to flow pulsatility. Pulsatile flow ghosting and smearing occur due to non-consistent phase shifts induced by non-consistent velocities present during the imaging procedure. Cardiac gating is one method for solving this problem. In the present method, we obtain more consistent imaging procedure velocity by measuring the velocity average over the entire cardiac cycle, instead of using instantaneous velocity. The average velocity is thus measured by obtaining and averaging N velocity observations, where $2NT_R$ is approximately equal to a multiple M (with M being a positive number, and preferably a positive integer) of the sample organism's pulse period (1/PR), where PR is pulse rate. Thus, $N=60(M)/(2T_R \times PR)$. Cardiac synchronization is not required, because the average flow velocity is substantially invariant with the portion of the cardiac cycle measured, provided that the duration of the averaging interval is approximately equal to an integral number of heartbeats.

There has been described presently preferred embodiments of our novel rapid-scan NMR angiography technique. Many variations and modifications will now occur to those skilled in the art. For example, to maximize suppression of stationary material and the like, the amplitude of both of the flow-encoding pulses $12a'$ and $12b'$ of the second sequence can be scaled by a common factor D, where D is any real number. It is our intent, therefore, to be limited only by the scope of the appended claims and not by way of specific details presented herein.

What is claimed is:

1. A method for rapidly acquiring at least one nuclear magnetic resonance (NMR) angiographic projection image of flowing material in at least a selected portion of a living organism sample having a cardiac cycle occuring at a cardiac rate, comprising the steps of:
   (a) immersing the sample in a main static magnetic field;
   (b) nutating by an angle α which is less than 90°, in the initial part of each of a first sequence and a second sequence of a sequential pair of imaging sequences for each of a multiplicity S of phase-encoding amplitudes operating upon said selected sample portion, the spins of all nuclei of a selected species and with a repetition time interval $T_R$ between sequential nutations being less than the reciprocal of the cardiac rate;
   (c) applying, after each nutation, a flow-encoding subsequence comprising a pair of alternating-polarity signal pulses in a first magnetic field gradient impressed upon the sample, in a first direction selected to cause a resulting NMR response echo signal from the spin of a moving nucleus to different from the NMR response echo signal resulting from the spin of a substantially stationary nucleus, each of the flow-encoding pulses in the first sequence of each pair having a polarity opposite to the polarity of the like-positioned flow-encoding pulse in the second sequence of each pair;
   (d) then acquiring, responsive to an imaging subsequence evoking an NMR response echo signal from at least the sample portion, a set of data in a response data acquisition time interval of each of the first and second sequences;
   (e) subtracting the data in each of the NMR response signal data sets acquired in a selected one of the first and second sequences from the data in the data set of the remaining one of the first and second sequences, to generate a difference data set from which response data obtained from stationary nuclei has been substantially removed;
   (f) repeating steps (b)-(e) a plurality N times, with N set approximately equal to $60(M)/(2T_R(PR))$, where M is a positive number and PR is the cardiac rate, to generate a plurality N of difference data sets for each of the different S amplitudes;
   (g) averaging all N difference data sets for each of the S amplitudes, to obtain a single average data set for each of the S amplitudes; and
   (h) generating, responsive to all S average data sets, each of at least one angiographic projection image, each lying in a plane having a preselected relationship with respect to the first direction.

2. The method of claim 1, wherein step (f) includes the step of setting M to be greater than 1.

3. The method of claim 2, further comprising the step of selecting M to be a positive integer.

4. The method of claim 3, further comprising the step of selecting N such that $30 \leq N \leq 64$.

5. The method of claim 4, further comprising the step of selecting α to be between about 15° and about 30°.

6. The method of claim 2, further comprising the step of selecting α to be between about 15° and about 30°.

7. The method of claim 1, wherein step (d) further includes the steps of: generating a readout magnetic field gradient signal pulse in a second direction, independent of the first direction, and substantially coincident with each acquisition time interval in each sequence; generating a dephasing pulse in the readout gradient signal prior to each acquisition time interval in each sequence; and providing each dephasing pulse with opposite polarity to the polarity of the associated readout gradient pulse.

8. The method of claim 7, wherein step (d) includes the steps of: providing a phase-encoding signal in the magnetic field gradient in a third direction orthogonal to the second direction; and assigning, in each pair of sequences, one of the multiplicity S of different amplitudes to the phase-encoding signal.

9. The method of claim 8, wherein step (d) further comprises the step of applying a projection-dephasing gradient signal in a fourth direction, substantially orthogonal to both the second and third directions, and of characteristics selected to limit the dynamic range of the response signals evoked from the nuclei with substantially stationary spins.

10. The method of claim 9, wherein step (b) includes the step of applying at least a portion of a slice-selective magnetic field gradient signal during each nutation.

11. The method of claim 10, further comprising the step of applying a flow-compensation portion in the slice-selective magnetic field gradient direction, after step (b) is complete and prior to commencement of step (d), with the flow-compensation portion having characteristics substantially those of a temporal mirror-image of the slice-selective signal portion, mirrored about a time selected to be after completion of step (b) and before commencement of the flow-compensation slice-selective signal portion.

12. The method of claim 11, further comprising the step of applying a flow-compensation readout gradient portion in the readout gradient direction, after the nutating subsequence of step (b) is completed and prior to commencement of the readout pulse and dephasing pulse portion of the readout gradient signal, with the flow-compensation portion having characteristics substantially those of a temporal mirror-image of the readout gradient and dephasing pulse portion of the readout gradient signal, mirrored about a time selected to be prior to that readout gradient and dephasing pulse portion.

13. The method of claim 12 further comprising the step of selecting N such that $30 \leq N \leq 64$.

14. The method of claim 13, further comprising the step of selecting $\alpha$ to be between about 15° and about 30°.

15. The method of claim 7, further comprising the step of applying a flow-compensation readout gradient portion in the readout gradient direction, after the nutating subsequence of step (b) is completed and prior to commencement of the readout pulse and dephasing pulse portion of the readout gradient signal, with the flow-compensation portion having characteristics substantially those of a temporal mirror-image of the readout gradient and dephasing pulse portion of the readout gradient signal, mirrored about a time selected to be prior to that readout gradient and dephasing pulse portion.

16. The method of claim 15, further comprising the step of selecting N such that $30 \leq N \leq 64$.

17. The method of claim 16, further comprising the step of selecting $\alpha$ to be between about 15° and about 30°.

18. The method of claim 1, wherein step (b) further comprises the step of synchronizing the start of each repetition time interval $T_R$ to a selected event external to the sample.

19. The method of claim 18, wherein the synchronizing step comprises the steps of: providing a trigger signal for each zero-crossing of an AC signal, with frequency F, energizing the NMR imaging system; and then using every C-th sequential one, where C is a selected integer, of the F trigger signals-per-second to synchronize the start of the next sequence.

20. The method of claim 19, wherein only the positive-going zero-crossings of the A.C. signal, with F=60 Hz., are used; C=2, and $T_R = 1/30$ second.

21. The method of claim 1, wherein step (c) further comprises the step of scaling the flow-encoding subsequence in the second sequence of each pair by a factor D, where D is any real number.

* * * * *